United States Patent
Seo et al.

(10) Patent No.: US 10,650,510 B2
(45) Date of Patent: May 12, 2020

(54) SUBSTRATE INSPECTION APPARATUS AND METHOD

(71) Applicant: KOH YOUNG TECHNOLOGY INC., Seoul (KR)

(72) Inventors: Seung Ae Seo, Hwaseong-si (KR); Yeon Hee Lee, Seoul (KR); Won Mi Ahn, Goyang-si (KR); Hye In Lee, Gwangmyeong-si (KR); Jong Hui Lee, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 14 days.

(21) Appl. No.: 15/747,497

(22) PCT Filed: Jul. 26, 2016

(86) PCT No.: PCT/KR2016/008175
§ 371 (c)(1),
(2) Date: Jan. 25, 2018

(87) PCT Pub. No.: WO2017/018788
PCT Pub. Date: Feb. 2, 2017

(65) Prior Publication Data
US 2018/0218486 A1     Aug. 2, 2018

(30) Foreign Application Priority Data
Jul. 27, 2015  (KR) .................. 10-2015-0106001

(51) Int. Cl.
*G06T 7/00* (2017.01)
*G01B 11/26* (2006.01)
(Continued)

(52) U.S. Cl.
CPC .............. *G06T 7/001* (2013.01); *G01B 11/24* (2013.01); *G01B 11/25* (2013.01);
(Continued)

(58) Field of Classification Search
None
See application file for complete search history.

(56) References Cited

U.S. PATENT DOCUMENTS

| | | | |
|---|---|---|---|
| 5,093,797 A | | 3/1992 | Yotsuya et al. |
| 5,245,671 A | * | 9/1993 | Kobayashi ......... G01N 21/8806 382/150 |

(Continued)

FOREIGN PATENT DOCUMENTS

| | | |
|---|---|---|
| CN | 10-1358934 | 2/2009 |
| CN | 10-1532819 | 9/2009 |

(Continued)

OTHER PUBLICATIONS

International Search Report for International Application No. PCT/KR2016/008175, dated Nov. 1, 2016.
(Continued)

*Primary Examiner* — Fayyaz Alam
(74) *Attorney, Agent, or Firm* — Kile Park Reed & Houtteman PLLC

(57) ABSTRACT

Disclosed are a substrate inspection apparatus and a method for displaying a component in a three-dimensional inspection of a substrate. The substrate inspection apparatus measures a substrate or an inspection target region of interest of the substrate and displays an image of components positioned within the measured region on a display unit. The image of the components displayed on the display unit may be displayed in a predetermined reference direction. The difference between the reference direction and a direction in which the actual component is disposed on the substrate is displayed in the form of a numerical value or a figure. Alternatively, the image of the component in the reference direction and the image of the actually disposed component are simultaneously displayed on a screen, and a user may
(Continued)

convert a display method of the image by using a toggle button.

11 Claims, 8 Drawing Sheets

(51) Int. Cl.
  *G01B 11/24* (2006.01)
  *G06T 7/60* (2017.01)
  *G01B 11/25* (2006.01)
  *G01B 11/27* (2006.01)
  *G01R 31/28* (2006.01)
  *G01N 21/956* (2006.01)
  *H05K 13/08* (2006.01)
  *G06T 15/20* (2011.01)
  *G01R 31/309* (2006.01)

(52) U.S. Cl.
  CPC ...... *G01B 11/2513* (2013.01); *G01B 11/2527* (2013.01); *G01B 11/2531* (2013.01); *G01B 11/26* (2013.01); *G01B 11/272* (2013.01); *G01N 21/956* (2013.01); *G01R 31/2813* (2013.01); *G06T 7/00* (2013.01); *G06T 7/60* (2013.01); *G06T 15/20* (2013.01); *H05K 13/0815* (2018.08); *G01B 2210/56* (2013.01); *G01N 2021/95638* (2013.01); *G01R 31/309* (2013.01); *G06T 2207/10028* (2013.01); *G06T 2207/20092* (2013.01); *G06T 2207/30141* (2013.01)

(56) References Cited

U.S. PATENT DOCUMENTS

| | | | |
|---|---|---|---|
| 7,542,151 B2* | 6/2009 | Van Gastel | H05K 13/0815 356/614 |
| 2004/0207836 A1* | 10/2004 | Chhibber | G01N 21/4738 356/237.4 |
| 2006/0002604 A1* | 1/2006 | Sakai | G06T 7/001 382/141 |
| 2009/0034827 A1 | 2/2009 | Iden | |
| 2010/0019148 A1* | 1/2010 | Nara | H01J 37/28 250/307 |
| 2010/0024723 A1* | 2/2010 | Hasegawa | H01J 37/32743 118/500 |
| 2010/0142757 A1 | 6/2010 | Sandström et al. | |
| 2011/0002529 A1 | 1/2011 | Jeong et al. | |
| 2011/0038704 A1* | 2/2011 | Hawryluk | G03F 9/7003 414/800 |
| 2012/0045852 A1* | 2/2012 | Baccini | B41F 15/0818 438/14 |
| 2013/0003029 A1* | 1/2013 | Laidig | G03F 7/70291 355/53 |
| 2014/0307948 A1 | 10/2014 | Kamioka | |
| 2014/0373346 A1* | 12/2014 | Okamoto | H05K 3/1233 29/825 |
| 2015/0298153 A1* | 10/2015 | Baker | B05B 12/12 438/7 |
| 2015/0362552 A1* | 12/2015 | Ozawa | G01R 31/2891 324/750.23 |
| 2015/0362553 A1* | 12/2015 | Ozawa | G01R 31/2891 324/750.19 |
| 2016/0071261 A1* | 3/2016 | Yang | H01L 22/12 382/149 |
| 2016/0224718 A1 | 8/2016 | Jeong | |

FOREIGN PATENT DOCUMENTS

| | | |
|---|---|---|
| CN | 104111037 | 10/2014 |
| JP | 07-198355 | 8/1995 |
| JP | 2005-121478 | 5/2005 |
| JP | 2010-177291 | 8/2010 |
| JP | 5182121 | 1/2013 |
| KR | 10-1994-0020878 | 9/1994 |
| KR | 10-2007-0122014 | 12/2007 |
| KR | 10-2010-0085680 | 7/2010 |
| KR | 10-1457040 | 10/2014 |
| WO | 2006/024908 | 3/2006 |

OTHER PUBLICATIONS

English translation of the Written Opinion of International Application No. PCT/KR2016/008175, dated Jan. 30, 2018.
Chinese Office Action with English translation for Chinese Application No. or Publication No. 201680043948.2, dated Aug. 9, 2019.
Examination Report dated Dec. 13, 2019 from the European Patent Office corresponding to European Patent Application No. 16830821.1.
Chinese Office Action, with English translation, corresponding to Application or Patent No. 201680043948.2, dated Mar. 19, 2020.

* cited by examiner

SUBSTRATE INSPECTION APPARATUS AND METHOD

TECHNICAL FIELD

The present disclosure relates to a substrate inspection apparatus and method, and more particularly, to a substrate inspection apparatus and method for displaying a component to be inspected mounted on a substrate in a substrate inspection process.

BACKGROUND ART

An electronic device includes one or more substrates such as a printed circuit board (PCB) on which various components are mounted. The components mounted on the PCB perform various functions according to the purpose of the electronic device. The components need to be electrically interconnected to supply current required for the operation of each component and to exchange signals between the components. In order to electrically interconnect the components, solder paste is printed on the substrate, the components are mounted on the solder paste, and a pad portion formed on the substrate and the lead of the component are connected to each other.

Thus, for proper operation of the electronic device, it is necessary for the components mounted on the substrate to be correctly arranged and for the electrical connection therebetween to be desirably realized. However, due to various causes in the assembly process, the arrangement and electrical connection of the components may not be completely performed. For example, the electrical connection may not be performed, or may be insufficiently performed due to the solder paste being insufficiently applied. On the other hand, the solder paste may be applied in excess, resulting in an electrical short between adjacent pad portions or leads.

In order to solve the above problems, a three-dimensional substrate inspection technique for inspecting mounted states of substrate components using a three-dimensional image obtained by irradiating an object to be measured with patterned light and photographing the object to be measured which is irradiated with the patterned light has been introduced and utilized. For example, Korean Patent Publication No. 10-2007-0122014 discloses a three-dimensional substrate measurement apparatus using the patterned light.

A substrate inspection apparatus may include a display unit for displaying an image of a measured substrate so that a user is capable of confirming a substrate to be inspected. The user may inspect the mounted state of each of the components mounted on the substrate from the image of the substrate to be inspected displayed on the display unit.

SUMMARY

It is difficult to precisely grasp the mounted state of a substrate, particularly the state in which solder paste is insufficiently applied or applied in excess, merely by displaying the image of the substrate to be inspected on the display unit. Accordingly, in order to closely inspect the mounted states of the components in the substrate inspection apparatus, the substrate inspection apparatus determines positions of the components in advance through a method such as receiving from the user, in advance, input indicating the positions of the components, and displays an enlarged image of the corresponding component according to a user's input after the measurement of the image is completed, so that the user may enlarge and inspect the displayed enlarged image in detail.

Meanwhile, the components arranged on the substrate may be arranged in various forms, and the arrangement is determined in the most efficient manner in consideration of various factors such as the shapes of the components, the connection relationship therebetween, the functions of the components, and the like. Thus, in some cases, the components may be arranged in a direction different from a direction recognized by the user.

FIG. 1 shows an example in which components are arranged on a substrate. On the substrate 160 shown in FIG. 1, a component 162 and a component 164 are arranged. The component 162 and the component 164 are the same kind of components, and a plurality of leads is arranged in each of the components 162 and 164 as shown in FIG. 2.

As described above, the inspection apparatus may display the enlarged image of the component to the user for close inspection. When the enlarged image of the component is displayed, the substrate inspection apparatus may display the component in a predetermined reference direction so that the user may check the mounted state for each lead of the component and examine the influence thereof. Such a reference direction may be, for example, a direction in which a position A of a bump corresponding to VCC or GND among various bumps of the components faces an upper end of the display unit. For example, FIG. 3 shows a conventional method in which the component 164 is enlarged and displayed with respect to the substrate shown in FIG. 1. A three-dimensional image 244 of a component 264 generated by measuring a substrate 260 and processing thereof is displayed on a display unit 240 of the substrate inspection apparatus. The component 264 is rotated clockwise about an upper surface 261 of the substrate at a predetermined angle on the substrate 260, but on the display unit, the enlarged image 244 of the component is displayed in such a manner that the bump corresponding to VCC and GND of the component 264 faces an upper end 241 of the display unit for convenience of inspection by the user. When the component is displayed in this manner, the user may easily determine which portion of the actual component 264 has a problem with the mounted state thereof, by making reference to an existing design drawing or the like for the enlarged image 244 of the component.

In addition, there is a case in which it is difficult to completely determine a mounted state only through the image displayed on the display device. For example, it may be difficult for the user to clearly determine the mounted state of each bump only through the image displayed on the display unit due to reflection of light in a solder paste portion or the like. Alternatively, the measured image itself may be defective due to the presence of a foreign substance or the like. In this manner, when the mounted state may not be grasped only through the image displayed on the display unit, the user directly observes the substrate visually and compares the observation result with the image displayed on the display unit to perform inspection.

However, although the component 264 to be inspected displayed on the display unit is mounted on the actual substrate by being rotated at a predetermined angle in the clockwise direction, the component 264 may be displayed on the display unit at a predetermined reference orientation set in advance. For example, in FIG. 3, the direction A, in which a bump corresponding to VCC and GND is displayed, is directed to the upper end 241 of the display unit 240 as described above. In this case, it may be difficult for the user to accurately grasp whether an actual component corresponding to the image 244 of the component is the component 262 or the component 264 on the substrate. This problem is exacerbated when the corresponding component has no apparent distinguishing characteristics from other components and has a shape similar to those of the other components.

Therefore, when a user inspects the mounted state of a component mounted on the substrate, there is a need for a method of clearly confirming the component to be inspected and inspecting the mounted state of the component, and eliminating confusion between two or more components, particularly when they are arranged in various directions.

According to an embodiment of the present disclosure, a substrate inspection apparatus includes a substrate transfer unit configured to transfer a substrate, a measurement unit configured to measure an image for inspection of the substrate, and a display unit configured to display a first component among a plurality of components arranged on the substrate, wherein the display unit displays a difference between a reference direction of the first component and an actual arrangement direction of the first component.

According to another embodiment of the present disclosure, the display unit may display the first component in at least one of the reference direction of the first component and the actual arrangement direction of the first component.

According to another embodiment of the present disclosure, the display unit may display the first component according to a first form for displaying the measured image of the component or a second form for displaying only a contour of the measured image of the component.

According to another embodiment of the present disclosure, the display unit may display the first component in the actual arrangement direction of the first component according to the second form, according to a user's input.

According to another embodiment of the present disclosure, the difference may be displayed as an angle, indicated by a numerical value or a figure.

According to one embodiment of the present disclosure, there is provided a substrate inspection method including: measuring an image of a substrate; and displaying the measured image, wherein the displaying the image includes displaying a first component among a plurality of components of the substrate and displaying a difference between a reference direction of the first component and an actual arrangement direction of the first component.

According to another embodiment of the present disclosure, the displaying the first component may include displaying the first component in at least one of the reference direction of the first component and the actual arrangement direction of the first component.

According to another embodiment of the present disclosure, the displaying the first component may include displaying the first component according to a first form for displaying the measured image of the component or a second form for displaying only a contour of the measured image of the component.

According to another embodiment of the present disclosure, the displaying the first component may include displaying the first component in the actual arrangement direction of the first component according to the second form according to a user's input.

According to another embodiment of the present disclosure, the displaying the difference may include displaying the difference as an angle indicated by a numerical value or a figure.

According to another embodiment of the present disclosure, the substrate inspection device may further includes measuring an image of a test substrate on which the plurality of components is mounted, generating a three-dimensional image of each of the plurality of components as an inspection criterion for each of the plurality of components, displaying the three-dimensional image generated as the inspection criterion for the first component among the plurality of components in the reference direction of the first component, and further displaying a difference between the reference direction of the first component and the actual arrangement direction of the first component.

A substrate inspection apparatus according to an embodiment of the present disclosure may display each component mounted on a substrate to be inspected in a direction desired by a user, regardless of the arrangement direction or the like in which each component is mounted on the substrate. As a result, even when a plurality of components is arranged and mounted on a substrate in various forms, the user may accurately determine the respective components without confusion. In addition, even when a corresponding component displayed on a screen is required to be visually confirmed on the substrate, the user may visually inspect the corresponding component without confusion.

DETAILED DESCRIPTION

Embodiments of the present disclosure will be described with reference to the accompanying drawings. In the following description, well-known functions or configurations will not be described in detail if they obscure the subject matter of the present disclosure.

In this disclosure, various terms are used to define the embodiments, but the concept of the embodiments should not be construed as being limited to the terms used in this disclosure.

Figure 1:
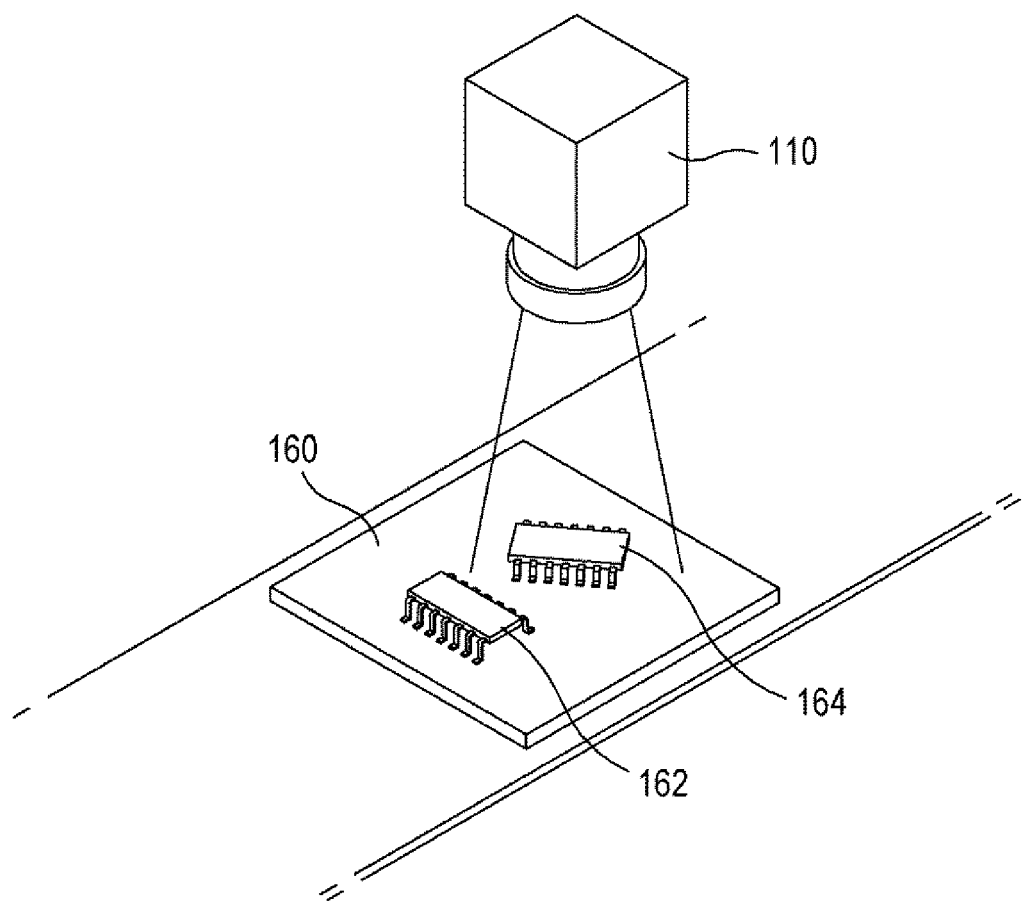
FIG. 1 shows an example of a method in which a substrate inspection apparatus inspects a substrate.
Figure 2:
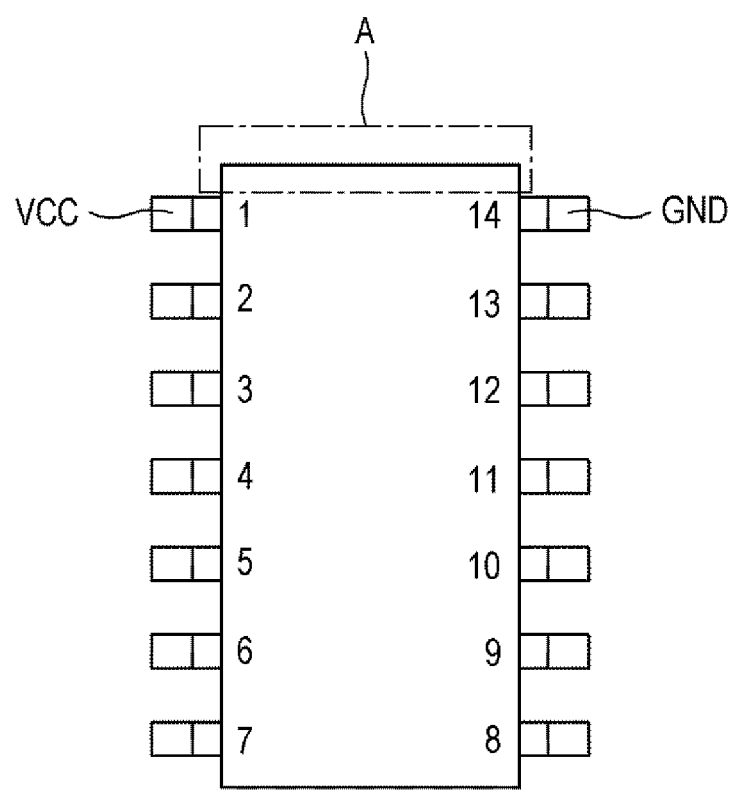
FIG. 2 is an enlarged view of a component mounted on the substrate in FIG. 1.
Figure 3:
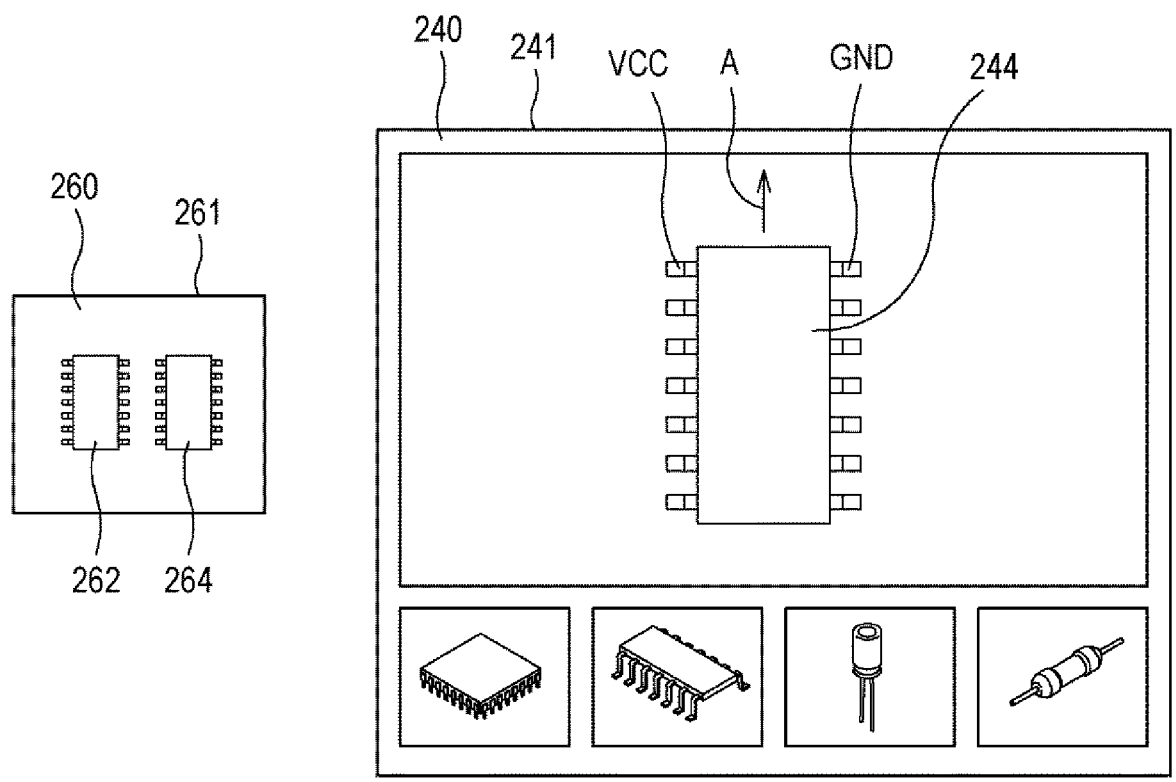
FIG. 3 shows an example of an image displayed for inspecting a mounted state of a component in a substrate inspection apparatus according to a conventional method.
Figure 4:
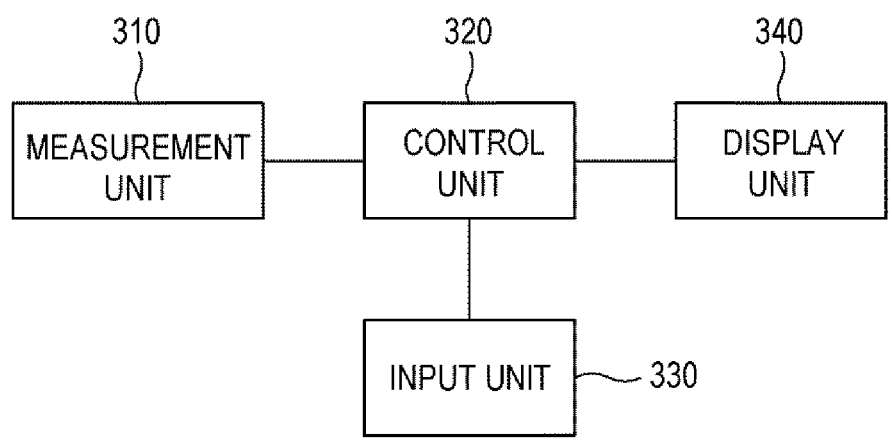
FIG. 4 is a block diagram schematically showing the configuration of a substrate inspection apparatus according to an embodiment of the present disclosure.

FIG. 4 is a block diagram schematically showing the configuration of a substrate inspection apparatus according to an embodiment of the present disclosure. The substrate inspection apparatus according to an embodiment of the present disclosure may briefly include a measurement unit 310, a control unit 320, an input unit 330, and a display unit 340. The measurement unit 310 included in the substrate inspection apparatus may perform a function of measuring an image of a substrate to be inspected. The control unit 320 may generate two-dimensional and three-dimensional shapes for the substrate to be inspected based on the image measured by the measurement unit 310. The substrate inspection apparatus may also include the input unit 330 and the display unit 340. A user interacts with the substrate inspection apparatus through the input unit 330 and the display unit 340 to perform operations necessary for performing substrate inspection, for example, various operations such as inputting or modifying a design drawing for the substrate to be inspected, setting a region to be inspected, inputting a reference value and a tolerance for an object to be inspected, and the like. The user may also interact with the substrate inspection apparatus through the input unit 330 and the display unit 340 to allow the substrate inspection apparatus to perform or stop the inspection of the substrate. The display unit 340 may display data processed by the control unit 320 so that the user may confirm the data. The data displayed by the display unit may include the previously generated three-dimensional image and an interface for inspection for user's convenience, but the present disclosure is not limited thereto.

Figure 5:
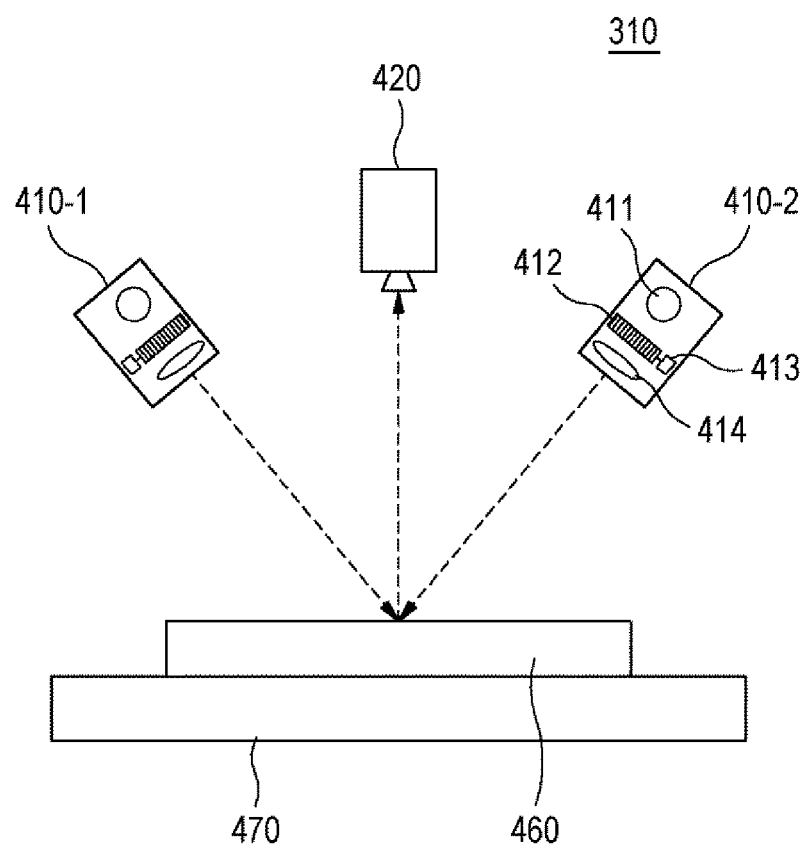
FIG. 5 schematically shows a measurement unit of a substrate inspection apparatus according to an embodiment of the present disclosure.

FIG. 5 shows in greater detail the case in which a substrate inspection apparatus according to an embodiment of the present disclosure performs measurement for inspecting a substrate. The measurement unit may include irradiation units 410-1 and 410-2 for irradiating pattern light to a substrate to be inspected and a camera unit 420 for photographing the substrate to be inspected, which is irradiated with the patterned light. The irradiation units 410-1 and 410-2 may irradiate the patterned light having a phase difference to a substrate 460 to be inspected that has been transferred by a substrate transfer unit 470, by allowing light emitted from a light source 411 to pass through a grating 412 and a grating transfer mechanism 413. The camera unit 420 photographs the substrate to be inspected irradiated with the patterned light and the control unit 320 processes the photographed image, so that a three-dimensional image of the substrate 460 to be inspected may be generated. Instead of using the grating 412 and the grating transfer mechanism 413, a liquid crystal display device may irradiate a phase-shifted patterned light using an image. However, the present disclosure is not limited thereto, and the substrate inspection apparatus may be implemented by other means capable of irradiating the phase-shifted patterned light.

After the substrate to be inspected is photographed and the three-dimensional image is generated, the substrate inspection apparatus may display two-dimensional and three-dimensional images of the substrate to be inspected on the display unit so that a user may confirm the images and perform substrate inspection. In addition, instead of measuring the entire substrate to be inspected, a specific inspection target region may be set in advance to perform inspection of a specific region of the substrate by a user's input, and an image only of the specific inspection target region may be acquired by changing a photographing area.

Figure 6:
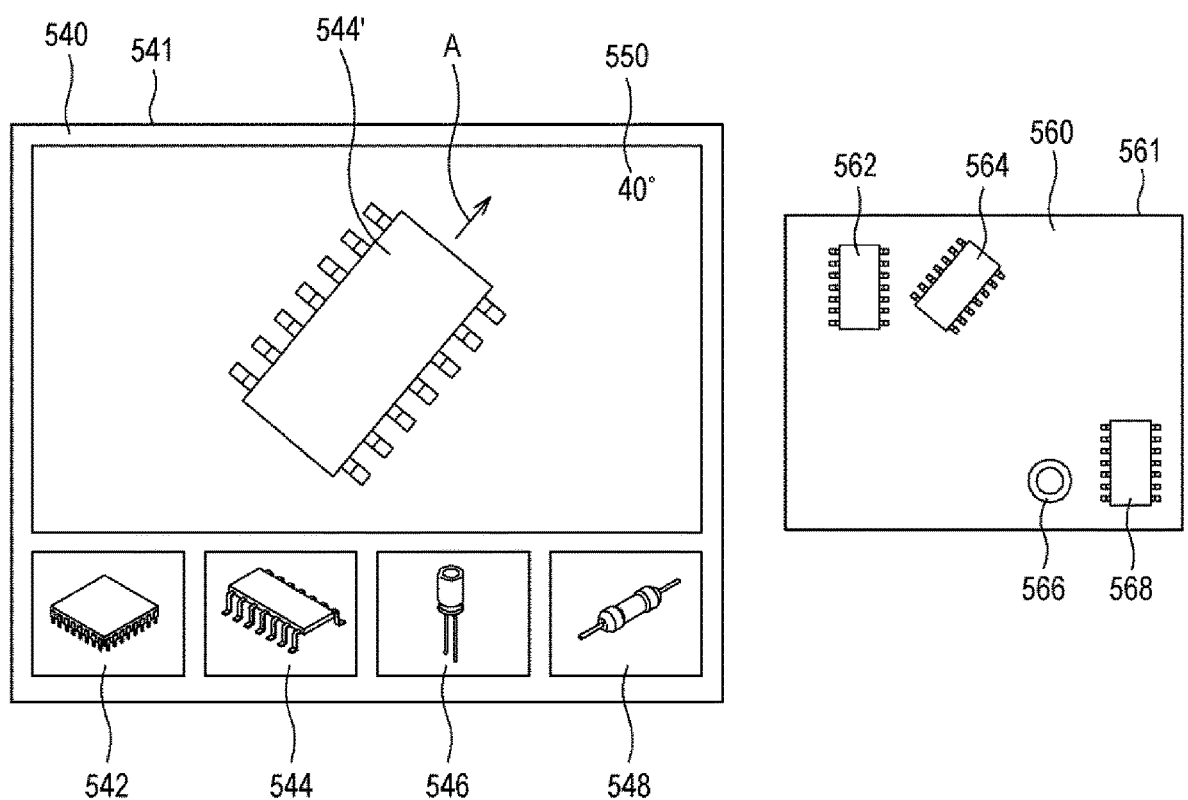
FIGS. 6, 7, and 8 show examples of a method in which a substrate inspection apparatus according to an embodiment of the present disclosure displays inspection results through a display unit.

FIG. 6 is a view showing a method of displaying an enlarged image of a component for a user's detailed inspection after a substrate inspection apparatus according to an embodiment of the present disclosure acquires two-dimensional and three-dimensional images of a substrate to be inspected. The substrate inspection apparatus measures a substrate 560 on which components 562, 564, 566, and 568 are mounted, generates two-dimensional and three-dimensional images of the measured substrate, and displays images of the components through the display unit 540. Reduced images 542, 544, 546 and 548 corresponding to the respective components 562, 564, 566 and 568 may be displayed on the display unit 540 so that the image of the corresponding component may be enlarged and displayed in response to a user's selection. An enlarged image 544' of the component 564 may be displayed to inspect the detailed mounted state of the component. The enlarged image 544' of the component may be displayed (544') in a reference direction A in which an input of VCC and GND faces an upper end 541 of the display unit, as in the example described above. In this case, when the user actually observes the state of the component visually, the user may not intuitively grasp which of the component 562 and the component 564 on the substrate is currently displayed on the display unit 540, as described above.

In order to solve this problem, the substrate inspection apparatus according to an embodiment of the present disclosure may display (500) a difference between the component 564 that is currently displayed in the reference direction on the display unit 540 and the component 564 that is displayed in the arrangement direction of the actual component. As described above, for example, the reference direction of the component may be in a direction in which VCC and GND input bumps are located close to surface 561 of the substrate 560. In the same manner even on the display unit 540, displaying in a direction in which VCC and GND input bumps are located close to surface 541 of the display unit may be defined as displaying in the reference direction of the component (564).

When the reference direction is defined as described above, it is possible to display a display angle (550) which shows how much the component 544 displayed (544') in the reference direction on the display unit (540) is rotated and disposed on the substrate and how much the component 564 is turned and disposed from the reference direction of the component 564. That is, through the content 550 displayed on the display unit 540 of FIG. 5, a user may grasp that the component corresponding to the image 544' displayed on the display unit 540 is rotated by 40 degrees with respect to the upper surface 561 of the substrate. When the substrate is observed visually, although the component 562 is arranged in the same direction and has the same shape as the image 544' of the component displayed on the display unit 540, the user may grasp that the component currently displayed on the display unit 540 is the component 564 positioned on the substrate without confusion by referring to the display 550, and may perform a visual inspection thereon.

Figure 7:
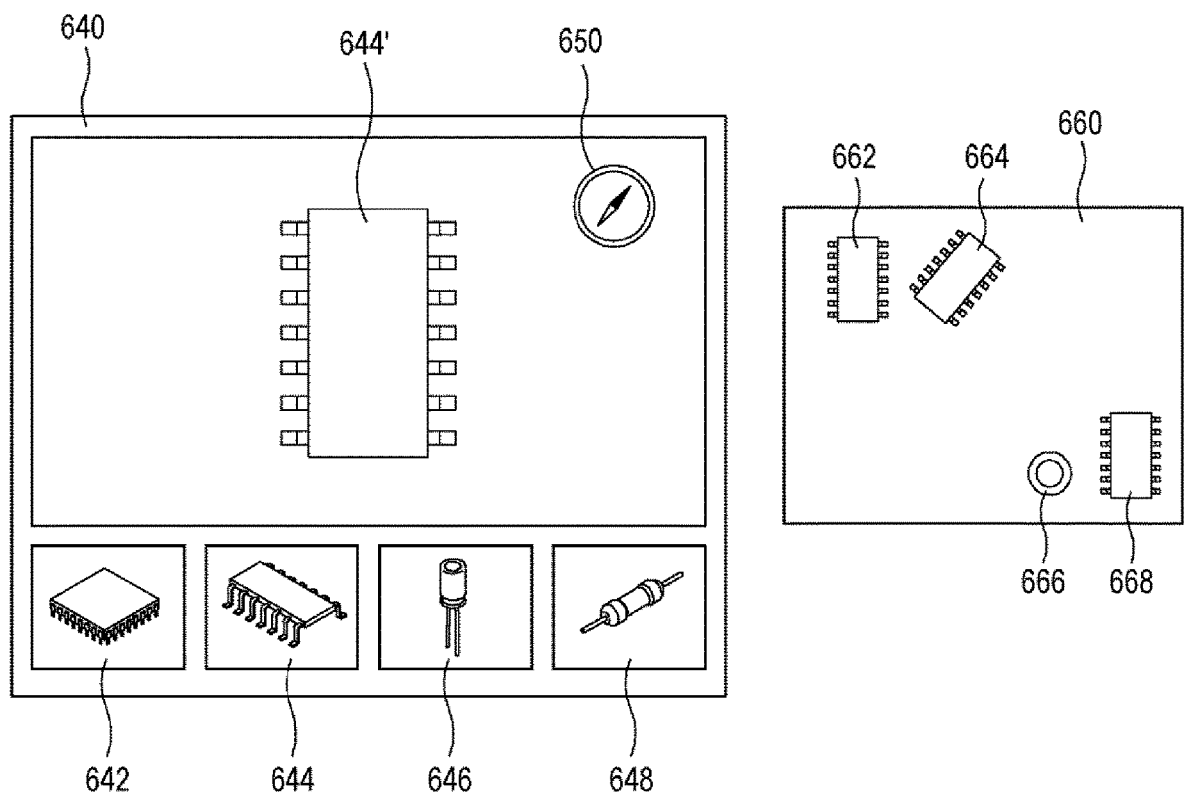

The indication of the display 550 of the difference does not necessarily have to be represented numerically as shown in FIG. 6, and those skilled in the art may also utilize other methods in which the user may intuitively grasp the corresponding component without confusion. For example, on the display unit 640 shown in FIG. 7, how much a component 662 is rotated from the reference direction is displayed in the form of a compass 650 together with an enlarged image 644' of the component 662. The display method shown in FIG. 7 has an advantage in that a rotated direction may be more intuitively grasped compared with the display method shown in FIG. 6. In addition, a direction may be displayed by the compass together with the numerical value of an angle at which the corresponding component is tilted. Those skilled in the art may also utilize a display method suitable for a user to grasp the rotated state of the corresponding component, in addition to the examples shown in FIGS. 6 and 7.

A user may display a component displayed on the screen in a desired direction in addition to the reference direction discussed above or the direction in which the component is arranged on the actual substrate. The user may input a command to change the direction of the component displayed on the screen through various input devices. For example, the user may change and display the direction of the component displayed on the screen by using arrows on the keyboard. Alternatively, the user may input, through the keyboard, whether to display an image of the component rotated by a certain degree with respect to the reference direction. Alternatively, the user may rotate the direction of the displayed component in units of, for example, 90 degrees by clicking a rotation button (not shown) displayed on the screen. Alternatively, the user may utilize a drag function of a mouse to rotate and display the image of the component. Alternatively, the user may change the display direction of the component by rotating the screen using an input device such as a touch screen. In particular, the user may display each of the corresponding components on the screen by selecting the other components 562, 564, 566, 568, 662, 664, 666, and 668 shown in FIG. 6 or 7. Accordingly, in order to fix the display direction of the previously selected component even in such a transition, the user may input information to fix the display direction. Such an input may be achieved through a method of clicking a button displayed on the screen using a mouse or the like. Those skilled in the art may also utilize a method for rotating and displaying the image of the component displayed on the screen in various ways and fixing the same.

Figure 8:
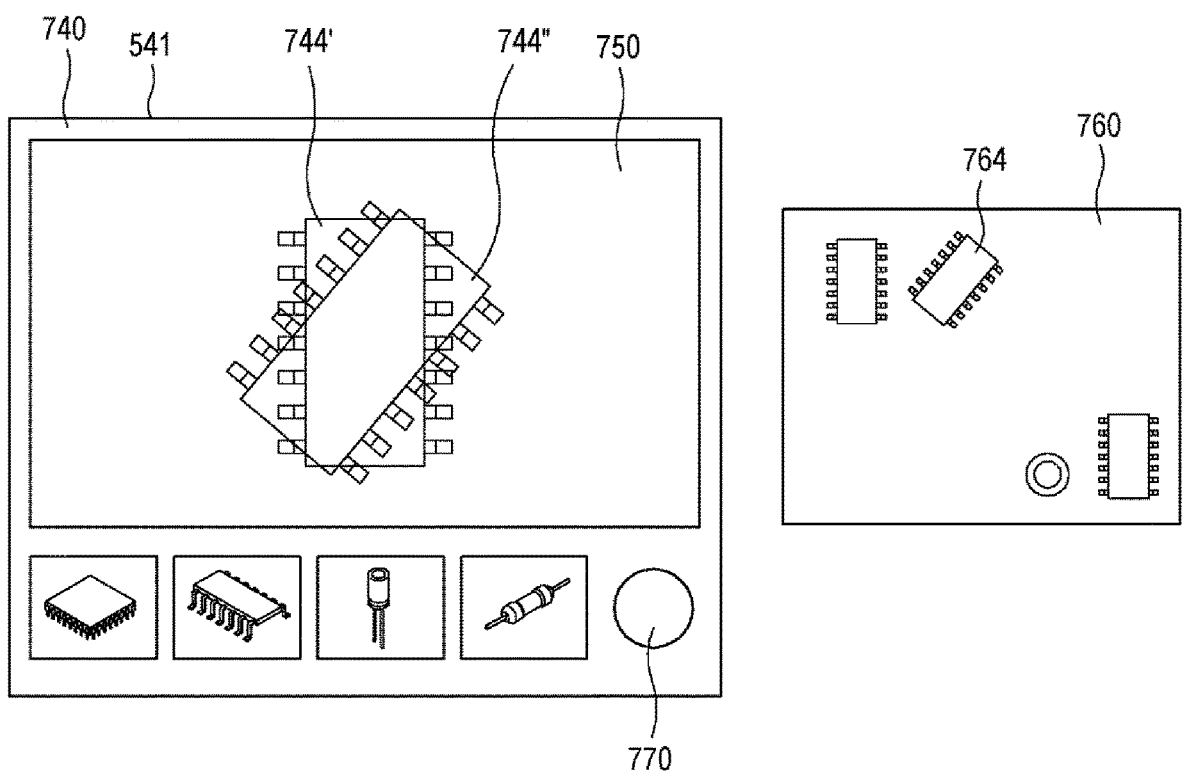

FIG. 8 shows a method in which a substrate inspection apparatus according to another embodiment of the present disclosure displays a component. A display unit 740 of the substrate inspection apparatus may display an enlarged image of a component in the reference direction and may separately display the direction in which an actual component is arranged on a substrate, as described above. In addition, an enlarged image 744' of a component 764 is displayed in the reference direction as shown in FIG. 8, and at the same time, an enlarged image 744" in the state in which the component 764 is actually arranged may be displayed to be overlaid on the image 744' displayed in the reference direction. When the image of the component is displayed in this manner, the user may display only the enlarged image 744' of the component displayed in the reference direction, may display the actual image 744" of the component 764 arranged on the substrate, or may display both the image 744' displayed in the reference direction and the image 744" of the actually arranged component such that they are overlaid on each other by clicking a toggle button 770 displayed on the display unit 740 using an input device such as a mouse. In addition, in order to prevent the image 744" of the actually arranged component from interfering with a user who inspects the enlarged image 744' of the component displayed in the reference direction displayed on the display unit 740, it is also possible to select a method of displaying only the contour of the component.

As described above, a method of measuring and displaying images of a substrate to be inspected and components mounted on the substrate to be inspected in order to inspect an actual substrate have been mainly discussed. However, a method of displaying the components in the substrate inspection apparatus or the substrate inspection method according to the present disclosure is not necessarily limited to the utilization of a method of actually inspecting the substrate or the components mounted on the substrate, and may be utilized in an interface for setting inspection conditions that should be performed before inspecting the substrate or the components mounted on the substrate.

As an example of a method for setting inspection conditions, two-dimensional and three-dimensional images may be first obtained with respect to an ideal test substrate on which all components are properly mounted, or an actual production substrate for which it has been determined that all components are properly mounted. Thereafter, images of the respective components of the corresponding substrate may be obtained, and the obtained images of the components may be set as ideal images as reference data to be compared at the time of actual substrate inspection.

The data generated as ideal comparison criteria in this manner may be displayed on the screen in a specific direction easily grasped by the user. Examples of the specific direction may be the reference direction discussed above and the like. As discussed above, when an actual substrate inspection is performed, if the components mounted on the substrate to be inspected are displayed only in a constant reference direction, the user may find it difficult to intuitively grasp which component mounted on the actual substrate corresponds to the component currently displayed on the display unit or may be confused. In addition, the same problem may also cause confusion in the image of the component displayed as an image to be compared and the direction of the component to be inspected.

Therefore, the method of displaying the image of the component discussed in this specification is not necessarily limited to being utilized only when inspecting the component mounted on the substrate. It will be appreciated by those skilled in the art that the method of displaying the image of the component may be similarly utilized when displaying the image of the component to set inspection criteria prior to inspection of the substrate.

While the present disclosure has been particularly shown and described with reference to exemplary embodiments thereof, it will be understood by those skilled in the art that the various embodiments of the disclosure described herein are not mutually exclusive and may be combined and modified in various forms without departing from the spirit of the disclosure, and at the same time, various changes and modifications may be made without departing from the spirit and scope of the appended claims.

What is claimed is:

1. A substrate inspection apparatus comprising:
a substrate transfer device configured to transfer a substrate;
a camera configured to photograph an image of the substrate for inspection; and
a display device configured to display a first image of a first component among a plurality of components arranged on the substrate in a reference direction of the first component, the first image of the first component being included in the photographed image of the substrate, and the reference direction of the first component being predetermined for displaying the first image of the first component in the display device,
wherein the display device displays a difference between the reference direction of the first component and an actual arrangement direction of the first component.

2. The substrate inspection apparatus of claim 1, wherein the display device displays a second image of the first component in the actual arrangement direction of the first component.

3. The substrate inspection apparatus of claim 2, wherein the display device displays the first image according to a first form for displaying the photographed image of the first component or a second form for displaying only a contour of the photographed image of the first component.

4. The substrate inspection apparatus of claim 3, wherein the display device displays the second image of the first component in the actual arrangement direction of the first component according to the second form by a user's input.

5. The substrate inspection apparatus of claim 1, wherein the difference is displayed as an angle indicated by a numerical value or a figure.

6. A substrate inspection method comprising:

photographing an image of a substrate;

displaying a first image of a first component among a plurality of components arranged on the substrate in a reference direction of the first component, the first image of the first component being included in the photographed image of the substrate, and the reference direction of the first component being predetermined for displaying the first image of the first component in the display device; and displaying a difference between the reference direction of the first component and an actual arrangement direction of the first component.

7. The substrate inspection method of claim 6, further comprising:

displaying a second image of the first component in the actual arrangement direction of the first component.

8. The substrate inspection method of claim 7, wherein the displaying the first image of the first component includes displaying the first image according to a first form for displaying the photographed image of the first component or a second form for displaying only a contour of the photographed image of the first component.

9. The substrate inspection method of claim 8, wherein the displaying the second image of the first component includes displaying the second image of the first component in the actual arrangement direction of the first component according to the second form by a user's input.

10. The substrate inspection method of claim 6, wherein the displaying the difference includes displaying the difference as an angle indicated by a numerical value or a figure.

11. The substrate inspection method of claim 6, further comprising:

photographing an image of a test substrate on which the plurality of components is mounted;

generating a three-dimensional image of each of the plurality of components as an inspection criterion for each of the plurality of components; and displaying the three-dimensional image generated as the inspection criterion for the first component among the plurality of components in the reference direction of the first component.

\* \* \* \* \*